United States Patent [19]
Lynch et al.

[11] Patent Number: 5,721,007
[45] Date of Patent: Feb. 24, 1998

[54] PROCESS FOR LOW DENSITY ADDITIVE FLEXIBLE CIRCUITS AND HARNESSES

[75] Inventors: Thomas J. Lynch, Mechanicsburg; Ram K. Agnihotri, Harrisburg; Paul F. Engle, Mechanicsburg; Roger T. Banks, York; Ronald B. Barnes, Camp Hill; Earl Hennenhoefer, Harrisburg; Russell T. Lerch, Palmyra; Thomas O'Shea, York; John Yavor, Mount Joy, all of Pa.

[73] Assignee: The Whitaker Corporation, Wilmington, Del.

[21] Appl. No.: 429,220

[22] Filed: Apr. 25, 1995

Related U.S. Application Data

[63] Continuation-in-part of Ser. No. 303,095, Sep. 8, 1994, abandoned.

[51] Int. Cl.$^6$ .................................................. B05D 5/12
[52] U.S. Cl. .................. 427/98; 156/277; 204/192.14; 216/13; 427/123; 427/264; 427/273
[58] Field of Search ............................ 427/96, 97, 98, 427/117, 264, 273, 123; 204/192.14; 156/277; 216/13, 16

[56] References Cited

U.S. PATENT DOCUMENTS

| | | | |
|---|---|---|---|
| 2,607,825 | 8/1952 | Eisler | 175/41 |
| 2,849,298 | 8/1958 | Werberig | 41/43 |
| 2,984,597 | 5/1961 | Hennes | 154/99 |
| 3,090,706 | 5/1963 | Cado | 117/212 |
| 3,483,098 | 12/1969 | Kramer | 204/28 |
| 3,629,077 | 12/1971 | Gannoe | 204/28 |
| 3,634,223 | 1/1972 | Carter | 204/206 |
| 3,729,389 | 4/1973 | DeAngelo et al. | 204/15 |
| 3,819,502 | 6/1974 | Meuldijk et al. | 204/206 |
| 3,855,108 | 12/1974 | Bolz et al. | 204/206 |
| 3,956,077 | 5/1976 | Hamby, Jr. et al. | 204/15 |
| 4,053,370 | 10/1977 | Yamashita et al. | 204/13 |
| 4,144,118 | 3/1979 | Stahl | 156/659 |
| 4,431,500 | 2/1984 | Messing et al. | 204/206 |
| 4,444,619 | 4/1984 | O'Hara | 156/645 |
| 4,451,345 | 5/1984 | Nemoto et al. | 204/206 |
| 4,487,654 | 12/1984 | Coppin | 156/645 |
| 4,566,186 | 1/1986 | Bauer et al. | 29/852 |
| 4,705,592 | 11/1987 | Bahrle et al. | 204/192.14 X |
| 4,946,563 | 8/1990 | Yeatts | 204/15 |
| 5,035,918 | 7/1991 | Vyas | 427/53.1 |
| 5,099,219 | 3/1992 | Roberts | 337/297 |
| 5,112,462 | 5/1992 | Swisher | 205/165 |
| 5,137,791 | 8/1992 | Swisher | 428/612 |
| 5,145,553 | 9/1992 | Albrechta et al. | 216/13 |
| 5,196,819 | 3/1993 | Roberts | 337/297 |
| 5,242,562 | 9/1993 | Beyerle et al. | 204/206 |
| 5,294,291 | 3/1994 | Akahoshi et al. | 216/13 X |
| 5,306,160 | 4/1994 | Roberts | 439/62 |
| 5,343,616 | 9/1994 | Roberts | 29/846 |
| 5,393,580 | 2/1995 | Ma et al. | 428/29 |

OTHER PUBLICATIONS

Coating and Laminating Machinery Department; 28 Pages; *New Technology Horizon and Humanity;* 1993; Hirano Teeseed Co., Ltd.

Hot Melt Rotary Screen Printer; 2 Pages; 1992 Nordson Corporation, Duluth GA

Stork Micro Rotary Screen Printing Systems Productivity, Quality and Flexibility; 16 Pages; Stork X-cel graphics, Holbrook, NY, No Date.

In-line Coating Systems; 6 Pages; 1992; Nordson Corporation, Norcross GA.

*Primary Examiner*—Michael Lusignan

[57] ABSTRACT

An additive electrical circuit (5) on a flexible substrate (1) fabricated by; metallization of the substrate, applying a mask pattern comprising a plating resistant material, applying a conductive circuit material in a circuit pattern that is uncovered by the mask pattern, and removing the plating resistant material and the metallization. Leaving the circuit (5) on the substrate (1) to be applied as a harness or instrument panel.

30 Claims, 8 Drawing Sheets

PROCESS FOR LOW DENSITY ADDITIVE FLEXIBLE CIRCUITS AND HARNESSES

This patent application is a continuation in part of U.S. application Ser. No. 08/303,095 filed Sept. 8, 1994, now abandoned.

FIELD OF THE INVENTION

The invention relates to the manufacture of conductive circuits on flexible insulating material, and more particularly, to manufacture of conductive circuits by an additive manufacturing process adapted to produce thin and thick flexible cable, flexible connectors, and flexible harnesses. A special attribute is the ability to produce economical, low density circuits.

BACKGROUND OF THE INVENTION

A configuration of flat conductive circuits on a substrate of flexible insulating material is well known. The circuits are fabricated on the surface of the substrate by a manufacturing process that is a subtractive process.

According to a typical subtractive process, an insulating substrate is laminated with copper foil covering the substrate making a three layer structure of substrate, adhesive and foil. The foil is covered by a photosensitive material that is resistant to a metal etchant. The photosensitive material is photoexposed by illumination, to sensitize the material for removal when washed. During photoexposure of the photosensitive material, an opaque mask casts a shadow over portions of the photosensitive material. The mask shadow is configured in a pattern of an electrical circuit. Thereafter, when the photosensitive material is washed, the unshadowed material is removed, leaving the shadowed material remaining in a pattern of a desired circuit on the substrate. The metal is then etched, hence, subtracted from the substrate, except where the shadowed material resists the etchant. Thereafter the shadowed material is cleaned from the metal that remains as the electrical circuit adhered to the substrate. The adhesive layer is a disadvantage because of mechanical and thermal instability of adhesives. In the example of a fine line circuit, the adhesive thickness is 0.001 inches and the circuit is 0.0007 inches thick by 0.005 inches wide, which cause both circuit positional tolerance and contact force problems. Customers want an adhesiveless solution.

Figure 10:
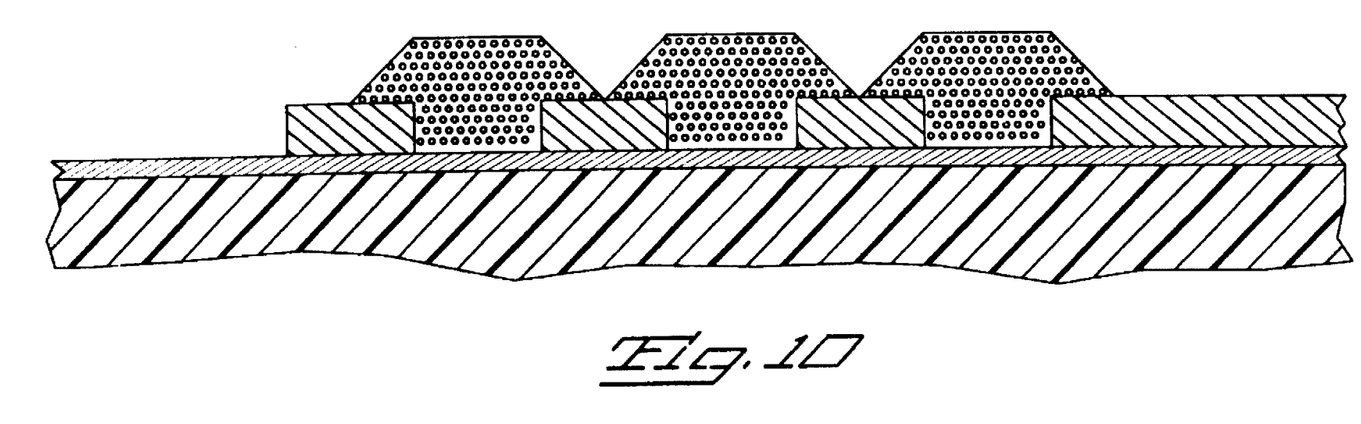
FIG. 10 shows the appearance of the plated circuit when circuit depth is twice that of the mask.

Another process to manufacture circuits is to electrochemically grow the circuits which can solve the adhesive problem if metal is directly bounded to substrates. When circuits are electrochemically grown onto a masked, metalized surface, the vertical growth of the circuit is equaled by the horizontal growth, once the height of the mask is exceeded. FIG. 10 shows the appearance of the plated circuit when circuit depth is twice (or greater) that of the mask. Obviously, the individual circuits will join into a single sheet at a calculated product of mask thickness, centerline space between circuits, and plating thickness. The only way to produce precision circuits is to have the mask thickness comparable to the desired plating thickness.

Many large circuits require thick conductors to carry current and large total size to serve an end function. For example, an automotive instrument panel is an array of lights, switches, gauges and displays whose surface area is determined by the required ergonomics for the users and current requirements of the individual services, see FIG. 8. Approximately eighty percent of the area does not contain circuits. The simple solution of covering all metalized surface which will not be in the final circuit with a mask that is two to five mil thick is very expensive in consumed masking solution and waste disposal for spent mask after stripping.

An application to manufacture flexible circuits is to use circuits in electrical harnesses. Currently, electrical harnesses utilize round wire technology. A harness is desirably thin, reliable and a single component to decrease cost.

A drawback of the each above indicated process resides in the wasteful removal of metal and contaminated fluids. An additive process would apply metal solely where needed on the substrate.

A round wire in a harness is a thick wire in comparison to flat circuits. Flat circuits are definitely thin, unfortunately not all flat circuits are suitable for harnesses. For example, an etched circuit the size of a harness would be prohibitively expensive. Moreover, each time a cable, like flat flexible cable, is spliced as it is necessary in current harness construction, the cable becomes less reliable and more costly and bulky.

A harness that is thin, reliable, and a single component is also an object of this present invention which solves many of the present harness problems.

SUMMARY OF THE INVENTION

According to the invention, an additive process applies conductive material onto flexible insulating material solely at locations where the conductive material is needed.

In one embodiment of the present invention particularly when the conductive material comprises thin and narrow circuits on the flexible insulating material, an additive process reduces waste of the metal.

In another embodiment of the present invention particularly when the conductive material comprises thick, low density circuits on the flexible insulating material, an additive process reduces waste of the metal. The additive process entails using a high resolution printing method to apply the mask to the metalized surface at two depths. At the edges of the conductive material the mask is equal or greater than the depth of the desired product circuit, while the remaining masked area is only sufficient to prevent electrochemical growth of metal. The depth of the resist material able to prevent electrochemical growth of the conductive material is less than 0.00003 inches by experiment. The minimum depth might be a few hundred Angstroms.

In another embodiment of the present invention, a harness circuitry is provided by the two additive processes that applies conductive material onto flexible insulating material solely at locations where the conductive material is needed.

An embodiment of the invention will now be described with reference to the accompanying drawings, according to which:

FIG. 7 illustrates the theory based growth of a circuit on the metallized surface.

FIG. 11 illustrates a 6X magnification and a 50X magnification of bubble-free resist material effects, as figures "a" and "b" respectively.

FIG. 12 illustrates a 6X magnification and a 50X magnification of foaming resist material effects, as figures "a" and "b" respectively.

DETAILED DESCRIPTION

The invention pertains to a cost effective process for flexible circuits and small line spacing that is beneficial in harness technology. Flexible flat cable (FFC) can be made cost effective by this process. Normally, the cost of manufacturing FFC per conductor increases as the centerline spacing decreases because the cost of the small flat copper wires increases faster than the consumption of plastic decreases. In this case, the cost declines because cost is proportional to circuit area. The process has a short cycle time and avoids large copper waste recovery. A particular advantage is the ability to achieve fine resolution and close dimensional tolerances in masking and in circuits produced by masking. Another particular advantage is the ability to produce economically thick, low density circuits on a surface. The mass and volume of discarded waste products is kept to a minimum, enabling economical production. Another advantage is the adhesiveless nature of and process, with the metal directly bound to the substrate.

Figure 1:
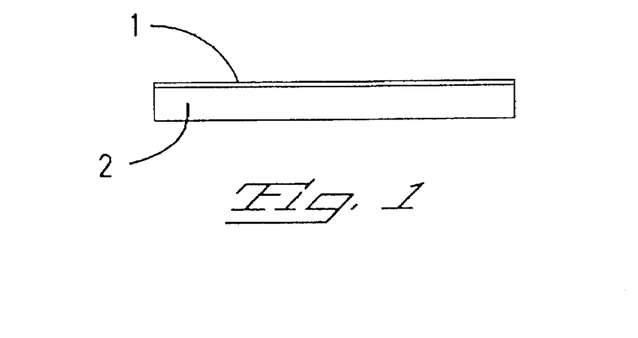
FIG. 1 is a schematic view illustrating very thin metal on an organic surface to metallize such a surface of, for example, a polyester material.

With reference to FIG. 1, step one of the process comprises deposition or application of a thin film 1 of metal onto an organic surface, for example, a surface of a plastic film 2. The metal 1 can also be a thin film that is laminated to the plastic film 2. The metallized plastic film has such a thin metal layer that the film 2 retains its original flexibility prior to being metallized. Bending and flexing of the film 2 can occur without cracking the metallized layer 1.

The organic surface can be a glass reinforced material suitable for circuit board applications, a "B" stage version of those glass reinforced materials, or a plastic film like the following: (I) Poly (ethylene, phthalate), (II) Poly (propylene) (III) Polyethylene, (IV) Poly (vinylidene difluoride), (V) Polyamide, (VI) Poly (1-butene), (VII) Poly (4-methyl-1 -pentene), (VIII) Polyvinylchloride, (IX) a liquid crystal polymer, or Poly (ethylene naphthalate) (X).

The film 1 of metal can be composed of any suitable metal or metals, such that the resultant coating is conductive, is capable of being plated, and is removable in a process such as etching. If more than one metal is employed, the metals can comprise, alloys, materials in a layered structure or laminated structure, or a seed layer of one metal, e.g. Cr, V, N, or Sn; under the principle layer, e.g., Cu. Suitable metals comprise, Copper, Aluminum, Tin, Titanium, Nickel, Iron, Silver, Gold and Palladium. A special case is the deposition of conductive compounds like Titanium Nitride by sputtering Titanium in a nitrogen atmosphere. These compounds have excellent conductivity and corrosion resistance.

The thin film 1 of metal is sufficiently thin to allow flexing of the metallized film 2, flexibility is not an issue, i.e. 10,000 A° does not greatly effect flexibility, and to be removed to produce a minimum of waste products. The thin film 1 of metal is sufficiently thick to conduct electricity in an electroplating bath, approximately 800–1200 Angstroms, and preferably 2500 A. The thin film 1 of metal can be applied by one or more techniques comprising; sputtering, electroless plating on a catalyzed surface of the film, vacuum deposition, lamination, or chemical vapor deposition, CVD. Particularly, the first few 100 Å of copper is sputtered to gain the superior adhesion of metal to flexible film that results from sputtering and the next 1-2000 Å would be evaporated to gain the superior economics of evaporation. In the case of low pressure techniques, i.e., sputtering, vacuum deposition or CVD, the degree of adhesion of the thin metal film can be controlled by one or more pretreatments such as, plasm etches, oxygen plasma, and by addition of select atmospheres like argon. For example, layers like N, Cr, Fe or their alloys may be employed to improve adhesion. Control of this adhesion permits production of products that have the characteristics in the range of; from rigorous adhesion to the plastic film 2, to lacking adhesion to permit easy removal, depending upon the desired choices of such characteristics.

By way of example, metal such as copper having a thickness, for example, 1000 to 2500 Angstroms thick, is applied onto an organic surface, such as a surface of a plastic film 2. The copper is sputtered on 2 to 7 mils thick, flexible polyester film. For example, the film 2 can be polyimide or polypropylene. Nickel, Palladium and silver Aluminum can be used instead of Copper.

Figure 2:
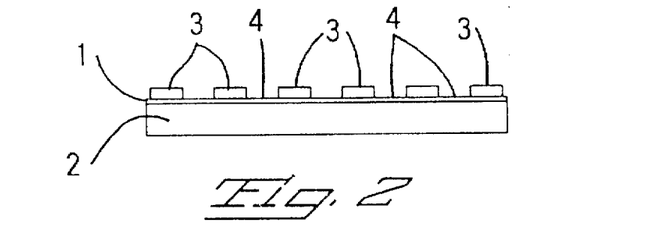
FIG. 2 is a schematic view illustrating a mask of ink or resist in a mask pattern applied on the metallized surface of FIG. 1.

With reference to FIG. 2, the metallized surface 1 of the plastic film 2 is coated with an adhering nonconductive material, referred to as a mask, that is resistant to an electrochemical plating bath. The normal photosensitive mask materials are expensive, $20–200 per pound, and contain reactive chemicals like quinone and hydroquinone which can affect plating. The styrene/maleic anhydride and styrene/acrylate copolymers of this invention are cheap, $2/lb and relatively benign to plating. The constituents of such a bath are commercially available with either acidic or basic pH.

The mask material, moreover, should be in a foamed state rather than a bubble-free form. In most instances, a mask is bubble-free by adding any conventional anti-foam material such as silicones, fluoropolymers or the like. Anti-foam materials are usually applied to mask compositions because the viscous polymer solution traps air which does not leave the mask upon drying. A foamed mask produces a thicker mask than a bubble-free mask, thereby it is also more economical since less mask material is required. The foamed mask furthermore produces a tougher film because the stress and strain absorbing abilities of the foam bubbles prevent micro-cracks from forming on the film as the mask dries. Lastly, removal of the foamed mask material during the demasking stage is easier because there is less material to remove and the mask surface area is significantly greater once the demasking solution starts to open the bubbles.

The nonconductive material is arranged in a mask pattern 3 that covers selected areas of the metallized surface 1 of the plastic film 2. Areas of the metallized surface 1 that remain uncovered by the mask pattern 3 define an electrical circuit pattern 4. The mask pattern 3 defines covered areas of the metallized surface 1 that will not contain an electrical circuit. The mask pattern 3 circumscribes the circuit pattern 4. The electrical circuit pattern 4 is a mirror image pattern of a planar electrical circuit that comprises, a flexible flat cable or other types of electrical circuit having different circuit patterns.

The material comprising the mask has the following characteristics; (1) be applicable as thick as necessary to prevent electroless growth by conductive material preferably five mil. thicknesses, and with a high degree of spatial resolution, (2) be a semipermanent mask that is mechanically stable and chemically resistant to subsequent process steps that will be described hereinafter, (3) be chemically and mechanically stable in plating baths and associated plating processes, (4) be easily removable with selection of the proper processing line conditions, e.g., bath pH, complexing agents, temperatures, and other line conditions.

Suitable mask material comprises; UV light and visible light curable photomasks (A), waxes like petroleum wax (B), and specialty polymers (C) like copolymers of Styrene and Maleic Anhydride and Acrylates, or Acrylic copolymers. Typically, metal plating baths have a low pH. A mask material stable when exposed to such baths would be stable in the range equal to or less than pH 5, and would be dissolvable to facilitate its removal in a pH range of 8 to 11. The above ranges are characteristic of the properties of the above-described copolymer systems.

The mask material should be capable of edge resolution such that pattern features can be produced with a dimensional tolerance of equal to or less than plus or minus 10% of the subject line width. For example, a line of 0.050 inch (0.10 cm) would have a tolerance which was no greater than that of plus or minus 0.002 inches (0.005 cm). Particularly desirable is a mask material that is capable of being applied by a continuous process. For example, a continuous mask applying operation applies one or more mask patterns onto a metallized plastic film at a speed that is synchronous with that of the film as the film is continuously reeled out, moved through a plating bath at a speed that will allow plating of a metal layer of a desired thickness onto the metallized plastic film. The mask is applied to the moving, metallized plastic film to circumscribe a circuit pattern on the film prior to the film moving through a plating bath that plates metal onto the circuit pattern. A step and repeat masking operation can be performed, except that registration of the mask with the surface of the metallized plastic film is achieved with greater difficulty and at less speed, due to the film being moved and stopped, intermittently, and the mask being applied intermittently in synchronization with the step and repeat movement of the film.

A desirable application technique involves a computer software driven control that generates a correction to the mask application stage in response to feedback signals generated from continuous measurement of variations in the production of the mask and/or variations in the production of the plating produced by the plating bath. This desirable application technique can be particularly suited by an ink jet printer.

Another desirable application technique involves a rotating screen printer. The rotating screen printer uses a seamless rotary screen that has holes perpendicular to the axis of the drum, or has the holes the conventional nine degrees off perpendicular. A squeegee presses the ink in the screen through the perforated screen wall on to the metallized plastic film. A pump and a level control guarantee a constant ink supply. Higher squeegee pressure results in more ink delivery on the metallized film. Thus, squeegee pressure determines the quantity of ink delivered. By utilizing a rotating screen printer the metallized plastic film can have a width ranging from millimeters to over three meters which makes this application technique so valuable.

In particular, the film needs to be pre-conditioned in a web pre-conditioner when the ink mask is applied by a rotating screen printer. The web pre-conditioner pre-shrinks the film at a temperature equal to or greater than the maximum temperature that the film or circuit will experience in later processing or in final service life.

Rotating screen printing and a laser jet printing are distinct in numerous ways. Such obvious distinctions include 300 dots per inch to 600 dots per inch difference and also comparing the masks to a stored computer file versus instantaneous feedback system that allows for immediate correction. These two printing methods do provide excellent masks, in particular the laser jet printing method.

In one embodiment, the original metallic film 1 can be sufficient for the electrical circuit requirements, which allows the mask to be applied at a speed that allows synchronization with a moving metallized plastic film without regard as to whether variations in plating are being affected. A software driven ink jet printer is a convenient implementation as well as a rotating screen printing method.

By way of example, the mask pattern 3 is made using a resist material, also known as a resist, via an ink jet printer, not shown, a rotating screen printer like produced by Stork® or Nordson® not shown, a roller wheel printer not shown, or a rotogravure process, not shown. One resist is a Styrene Acrylate polymer, available from AMP Incorporated, Harrisburg Pa. 17105. The resist material is resistant to acidic chemical baths. Alternatively, an ink that has resist properties, and that is resistant to basic, rather than acidic chemical baths is applied. The ink is commercially available from Dataproducts Corporation, 6250 Canoga Avenue, Woodland Hills, Calif., Telephone Number (818) 887-3803.

An ink jet printer is commercially available, for example, from Dataproducts Corporation. Other commercially available, ink jet printers can be used. The printer applies a resist material to a flexible composite sheet of polyester and copper. The printer applies resist having a viscosity that flows through a printing jet nozzle of the printer. The printer has the capability of applying resist in a layer of about 0.001 inches thick or thicker. A preferred dot pattern of 300 dots per inch, with an average of 4.7 mil. dot diameter when applied on a square grid of 3.33 mil. grid size. Four colors of resist can be used. The colors are combinations of 10% to 100% of magenta, cyan, yellow and black.

The printer head on which one or more nozzles are mounted can be displaced with respect to the composite sheet, at a speed of six inches (15.24 cm.) per minute.

One construction of a printer provides two heads, each at an angle of 7 degrees from the horizontal. Each head has 48 nozzles distributed along 60 inches (152.4 cm.) along the angle. Accordingly, two rows of nozzles, a total of 96 nozzles is provided. Another construction of a printer provides four head, each mounted on a shuttle one at a time. The speed of printing dots is one foot per second for one layer of dots having a layer thickness of 0.001 inch and a pattern of dots at 0.5 inch (2.54 cm.) wide, at 5,000 dots per second, with dots having a diameter of 4.7 mil.

The following speeds are achieved. Using the construction of two heads, passing the heads over a horizontal composite sheet of 5 feet width, each pass achieves 120 seconds per foot, or a speed of 6 inches per minute is achieved. For maximum speed, two fixed heads with a total 90 nozzles are used, and the pattern applied by the nozzles working intermittently is driven by a computer which turns on and off the nozzles. The speed achieved is 60 feet per minute. Speeds up to 100 feet per minute are attainable.

The thickness of a resist material, comprising the mask pattern 3, is achieved by varying the weight from 50–150 Nanograms, with 150 Nanograms preferred. The thickness is further varied by repeating the pattern of dots on top of one another. The gram usage of resist material is 150 nanograms per drop, times 90,000 drops per square inch, or 0.0135 grams per square inch, or 1.944 grams per square foot for a 0.001 inch layer thickness.

The following print samples were produced using a Material ID, see column title below, supplied by AMP Incorporated to Dataproducts Corporation who used their commercially available printer to apply a pattern of resist material having an Ink ID, see column title below.

| Sample ID | Material ID | Ink ID | Comments |
| --- | --- | --- | --- |
| 5/26/94-1A | Cu/bkg | SI2-K1 | |
| 5/26/94-2A | Cu/bkg | SI2-M2 | |
| 5/26/94-3a | Cu | SI2-K2 | minimum wetting material, remelt puddles |
| 5/26/94-4A | film | SI2-M1 | poor ink adhesion |
| 5/26/94-5A | film | S12-K3 | poor ink adhesion |
| 6/1/94-1A | film | XM7-M3 | very low PZT drive, light ink |
| 6/1/94 | Cu/bkg | XM7-M4 | remelt good flow |

The following observations of the samples were made. Light print and extraneous small dots on sample Jun. 1, 1994-1A were created by the way that particular print head (different from the May 26, 1994 tests) was initially set up for tests using this ink. The sample Jun. 1, 1994-1A was made with the proper drive levels. The key element shown on the two samples date Jun. 1, 1994 is increased adhesion of ink to the media material. The media material general wetting characteristics impeded ink flow as printed. The same Jun. 1, 1994-2A shows excellent coverage with image remelt. Some inks are not very compatible with some materials, while the XM7 ink was significantly more effective. Other useful processes, beside ink jet printing, include rotary screen phase transfer printing, flat screen printing, rotary screen printing and rotogravure printing.

Figure 3:
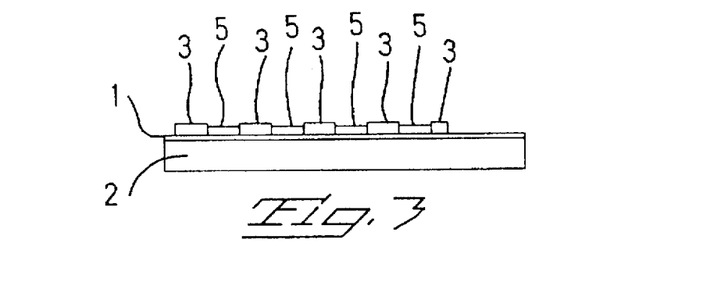
FIG. 3 is a schematic view illustrating relatively thick metal deposited on a circuit pattern on an exposed metallized surface that is uncovered by the mask pattern of FIG. 2.

With reference to FIG. 3, one or more layers of metal 5 are applied onto the exposed metallized plastic surface. The metal 5 can be any suitable layer or layers of elemental metal, alloy or combination thereof. The metals 5 comprise; Copper, Silver, Lead, Tin, Iron, Gold, Palladium and Nickel. Alloys comprise; Nickel-Iron, Tin-Lead; and Palladium-Nickel.

For example, the metal 5 is applied by electroplating according to known processes. The exposed metallized plastic surface comprises the circuit pattern 4 circumscribed by the mask pattern 3. The metal 5 applied to the exposed areas will form conductive areas of an electrical circuit. By way of example, Copper is additively grown electroless or electrochem in areas on the film exposed (0.5 to 5.0 mils. thick).

EXAMPLE 1

A laminated film of polyester and copper was supplied by AMP Incorporated, and was printed by Dataproducts Corporation with a pattern of resist material supplied by Dataproducts Corporation. Copper was plated on exposed areas of copper that was not covered by resist. The pattern of resist had an image resolution of 6 mil. wide lines and 6 mil wide exposed areas. A commercially available Copper Sulfate bath was used at room temperature, having a 1.9 pH. The resist was removed by a mild Sodium Hydroxide stripper, commercially available.

EXAMPLE 2

A laminated film of polyester and copper was supplied by AMP Incorporated, and was coated with a resist material, part number 985699-1, or part number 985720-1, available from AMP Incorporated. After room temperature drying of the resist material, two samples were immersed in a commercially available copper plating bath having a 1.9 pH at 65 Degrees Centigrade. No damage to the resist material by the bath was observed. The resist material was then stripped in an alkaline bath.

It is contemplated for an embodiment of the invention, that tin or tin-lead plating is applied in fluent form to the grown metal circuit prior to removal of the resist and removal of the very thin copper laminated to the polyester that was covered by the resist. The tin-lead solder is solidified at room temperature, and is capable of being reflowed by the application of heat to create a solder joint of the grown copper to an electrical device or devices, not shown, such as an electrical terminal and an insulated wire of an electrical cable.

Figure 4:
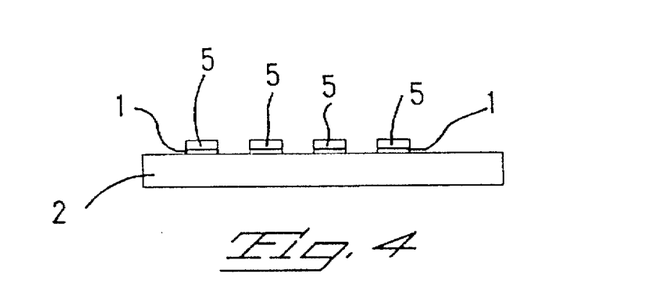
FIG. 4 is a schematic view illustrating the subject matter of FIG. 3 after the mask is stripped, and the metallized surface is bared to the organic surface.

With reference to FIG. 4, the mask pattern 3 is removed to expose the very thin, metallized plastic surface 1 that was covered by the mask pattern 3. Thereafter, the very thin metallized plastic surface 1 is treated to remove the very thin metal 1 thereon, leaving only the plastic surface 2. The plastic surface 2 electrically isolates the electrical circuits. A desirable economic and environmental process feature will now be discussed. When the metal 1 is removed with an acidic medium, the spent medium is suitable for use as plating bath feed for metallizing the organic surface 2, if the metal plating is the same as that to be plated onto the organic surface 2.

By way of example, the ink or resist 3 is stripped in base or solvent, and the sputtered copper 1 is etched to remove the same, leaving the additively grown copper 5 of substantial thickness and providing electrically conductive circuits. The conventional circuit etching process utilizes a cupperi chloride solution (a concentrated aqueous $CuCl_2$ and HCl). The conventional etching process normally entails a 1–3 minute etch and exposure time has to be controlled at 400 milliseconds. This conventional process is adaptable to the present invention, however, this conventional process requires uniform wetting by the etchant bath and reusing by the wash/neutralization solution is extremely difficult to complete with uniform quality in this short time period. An etchant can be diluted and its pH increased to slow the dissolution rate by the desired factor of 100–300::1. These measures to the etchant, however, are not as effective as a controlled current electrochemical etch. For example, a sputtered metal thickness of 5000 Å and atomic volume of copper at 11.869 (Å)$^3$ per atom, the removal rate per square inch of sputtered surface is 2.91 minutes with 50 milliampes current (using Faraday's law of equivalents (I*t)/F). In particular, ammonium phosphate is also suitable for removing the mask and sputtered conductive metal in a single step.

The circuit containing film 2 is carefully dried to remove surface water and absorbed water. A flexible flat cable is produced by this process when the circuits comprise conductors that are closely spaced together. The circuits can be in any planar pattern that has been circumscribed by the mask pattern 3.

An additive process requires metal removal and waste recovery of a very thin layer of copper. By contrast, a subtractive process requires removal and waste recovery of thick, laminated copper foil.

According to a further process step, a plastic film is laminated over the circuit as an insulator. The plastic film chosen as an insulator to cover the completed circuit can be any of the above plastic films referred to as being suitable for the metallized plastic film, or a plastisol or other suitable film. This plastic film does not require the chemical stability as the metallized plastic film that must survive chemical plating and chemical etching baths.

According to a further process step, terminators, such as electrical contacts, are applied to the circuits, for example, by soldering.

EXAMPLE 3

A circuit is produced according to the following process; (1) sputter 2500 A thick Copper onto 0.001 inch (0.0025 cm.) thick polyester film, (2) apply the circuit masks by ink jet printer, (3) plate Copper onto circuit patterns circumscribed by the masks to the desired thickness, e.g. 0.002 inch (0.051 cm.), (4) plate Tin to the desired thickness, e.g. 0.001 inch (0.025 cm.), (5) remove the masks, (6) use sulfuric acid or cuprous chloride to remove the residual Copper film with the circuit being protected by the Tin, (7) clean and dry the circuit on polyester, and (8) laminate a second layer of polyester to protect the circuit, with optional holes in the second film to permit access to the circuit.

Because additional metal is plated over the copper, e.g., Tin, selective etching can be done to remove metal only where it is not desired.

Figure 5:
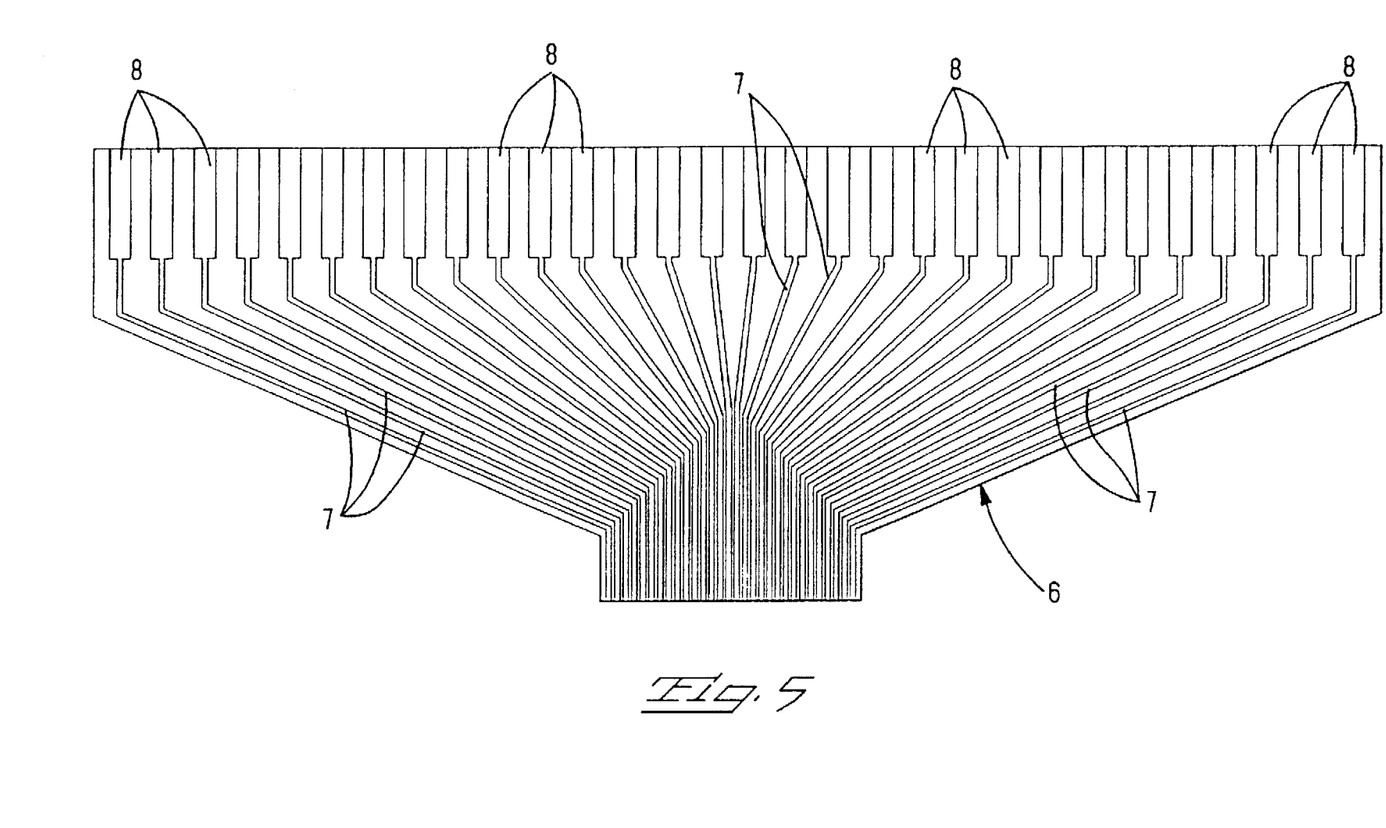
FIG. 5 is a plan view of a circuit.

With reference to FIG. 5, an electrical circuit 6 is shown greatly enlarged to illustrate the details. An additive circuit 6 of thirty conductors 7 is arranged in a parallel array. The conductors 7 are spaced apart on 0.5 mm. centerlines. The narrowest width of each conductor 7 is 0.3 mm. The conductors 7 extend outwardly diagonally from the array, and extend to respective solder pads 8. The solder pads 8 are in a parallel array that is 7.69 mm. wide. The conductors 7 and the solder pads 8 are applied to a flexible film 2, according to the processes described herein. The solder pads 8 are coated with solder in the form of a paste or a molten solder having a low melting temperature. The solder is a medium that forms a solder connection of the pads 8 to other electrical devices, not shown, when the solder is reflowed by the application of heat.

Figure 6:
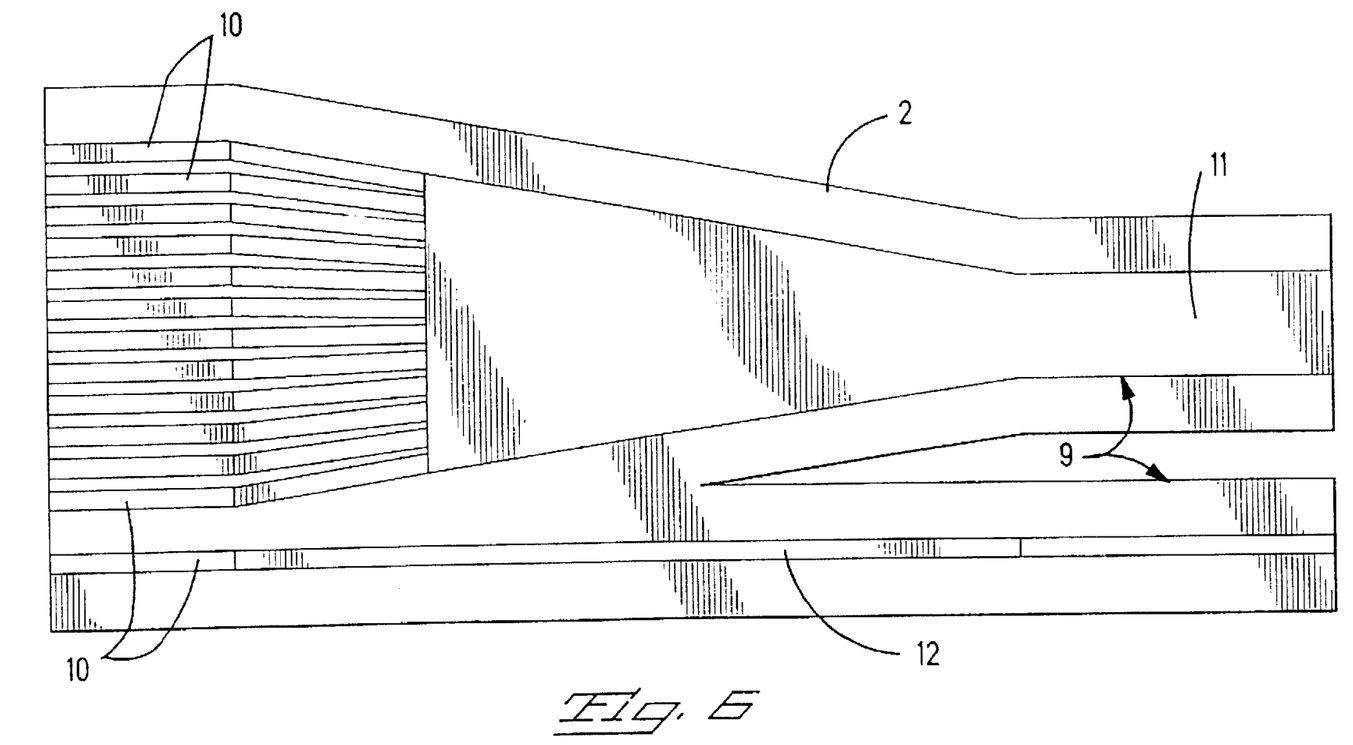
FIG. 6 is a plan view of a second circuit.

With reference to FIG. 6, another electrical circuit 9 comprises, a group of twelve conductors 10 joined together to form an elongated, tapered solder pad 11, and a thirteenth conductor 12 separate and spaced apart from the twelve conductors 10 and the solder pad 11. The twelve conductors 10 can be 0.6 mm. in width and spaced apart on 1.0 mm. centerlines. The circuit 9 is applied to a flexible film 2, according to the processes described herein. For example, solder can be used to join the twelve conductors 10 to separate insulated wires of an electrical cable, not shown. The thirteenth conductor 12 can be connected with solder to an electrical terminal, not shown.

In the other embodiment, a method of making flexible flat cable having a two-tiered resist layer is disclosed. This method is designed for preparing flat flexible cable.

Figure 7A:
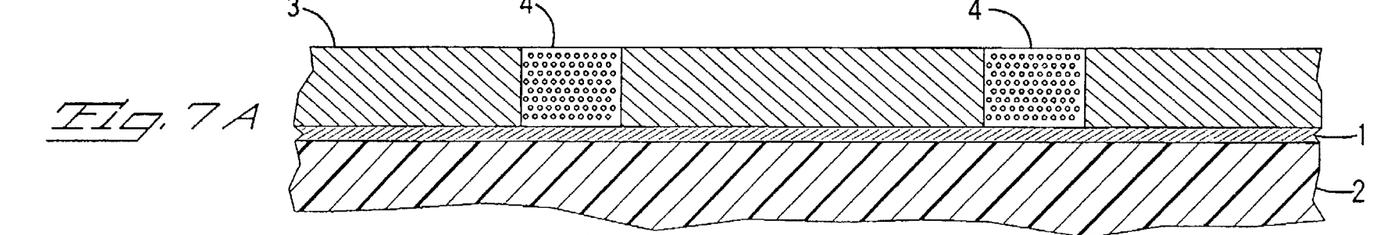
FIG. 7A showing the cross-sectional appearance of the plates circuit when the circuit and the mask have the same height.
Figure 7B:
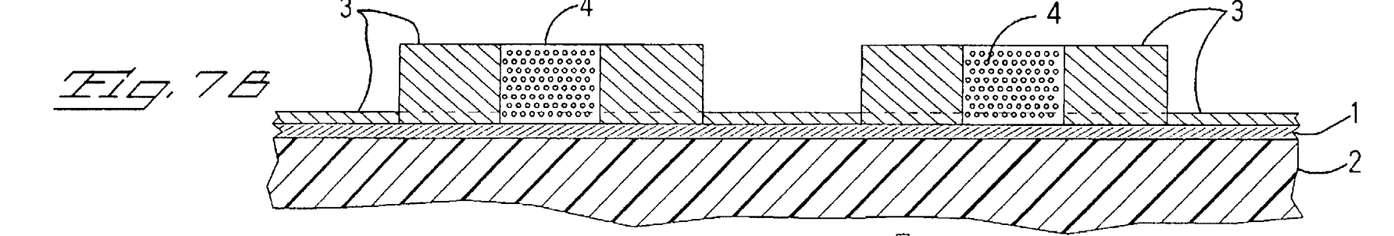
FIG. 7B illustrates a second view cross-sectional appearance of the plates circuit when the mask on the border of the circuit is the same height to the circuit while the remaining mask merely protects the metallized film.

The process is the same as the one-tiered resist layer method (illustrated in detail in FIG. 7A) set forth above of FIGS. 1–4; except the resist layer is deposited onto the metallized flat flexible film differently. The major difference is that the resist pattern depth at the edges of the conductive material be equal or greater than the depth of the desired conductive material; while the remaining resist layer not at the edges of the conductive material is of sufficient depth to prevent electrochemical growth of the conductive material, as shown in FIG. 7B. These different layers of resist, at the edges of the conductive material and the remaining areas to be masked, can be applied by the same instruments as set forth above. These instruments are merely altered to provide differing layers.

In particular, ink jet printing is conducted with high spacial resolution and multiple passes. The first pass masks the entire area which will not become a circuit to a depth of about 0.0001 inch and subsequent passes build the edge to the desired depth of the circuits. In Example 1 the mask at the desired circuit depth and position was 0.003 inch thick but only 0.005 inches wide. In this example only four percent of the material is required to serve as mask. This low percentage can be illustrated by the following chart:

Total Metalized area: 144 in$^2$

Total Masked area: 115.2 in$^2$

Mask at 0.003 inch thick: 0.35 in$^3$

Length of circuits @ 0.25 inch wide: 115.2 in

Border mask at 0.003 * 0.005 inches: 0.0035 in$^3$

Total mask by claim: 0.015 in$^3$

Savings 1-(0.015/0.035) * 100=95.7%

The other printing methods can also provide a second tier resist layer. As a matter of course, the other printing methods apply subsequent layers through other screens, rotogravures or roller wheels to the desired resist level in the desired locations, as set forth above.

Figure 8:
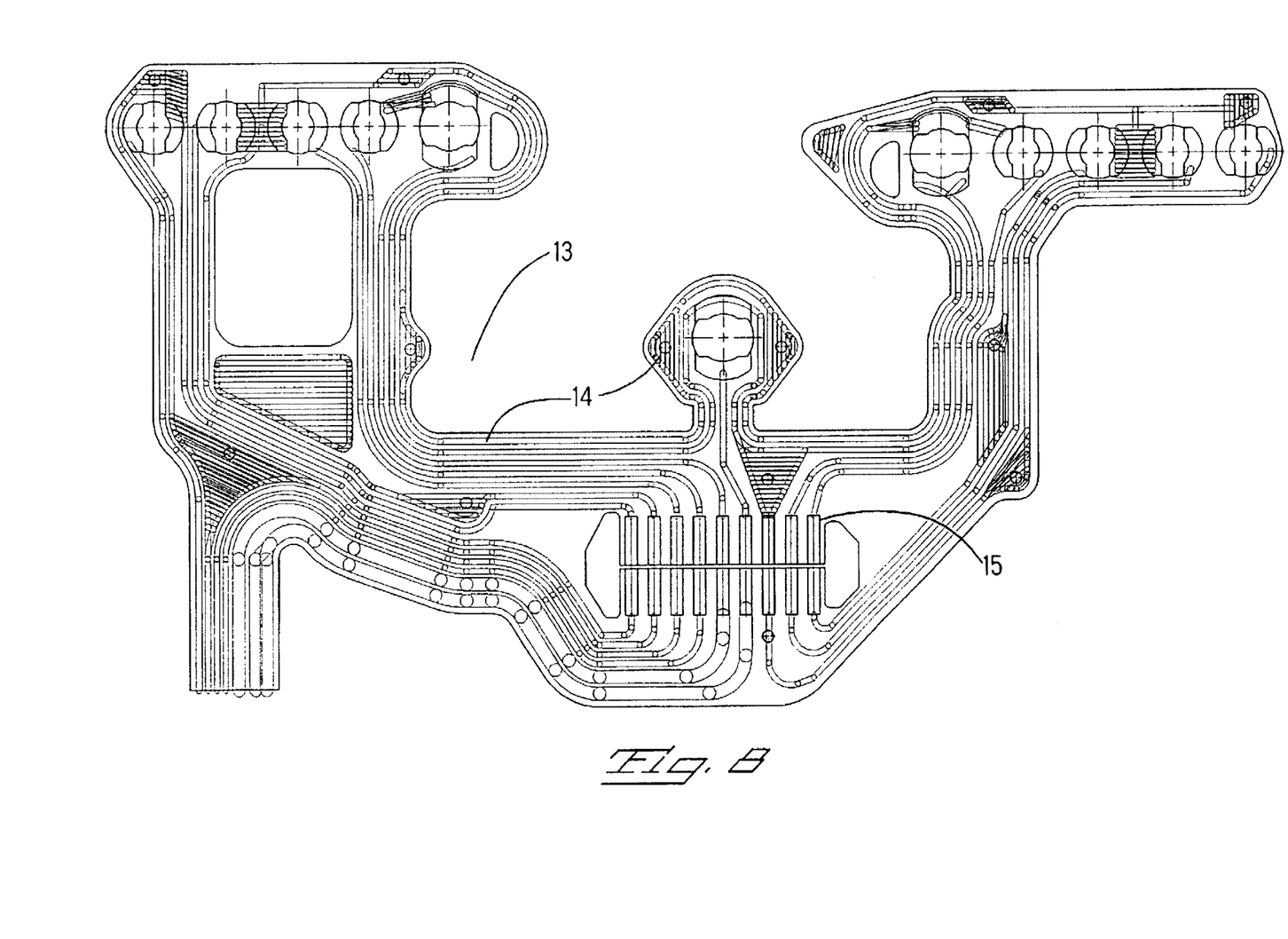
FIG. 8 illustrates an automotive instrument panel.
Figure 9:
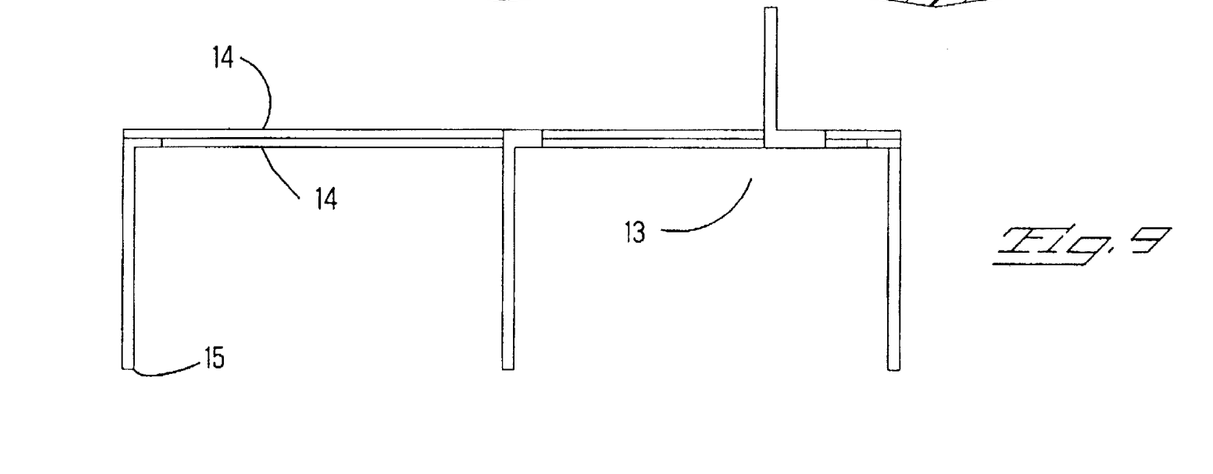
FIG. 9 illustrates a harness circuitry.

In reference to FIGS. 8 and 9 which respectively illustrate an automotive instrument panel and a harness, an electrical circuit 13 is shown. An additive circuit 13 of many conductors 14 is arranged in the desired format of the panel or harness. As can be illustrated, the conductors can have various centerlines, depths, and widths. The conductors are also attached to solder pads 15. Moreover, a harness is an electrical circuit that is either three or two dimensional and has multiple terminuses by a simple series of folds.

Besides the numerous electrical circuit applications which this invention can be attenuated, an electrical circuit can be created with different mask material as well. The difference between foamed and bubble-free mask can be best illustrated in the following example: a mask material comprising 74% Joncyryl 74, 14.5% Joncryl 85, 9.5% Joncryl 585 and 2% NH$_4$OH solution was applied to a film of 3000 Å of copper sputtered onto 0.003 inch thick polyester film, with and without an anti-foam agent.

Figure 11A:
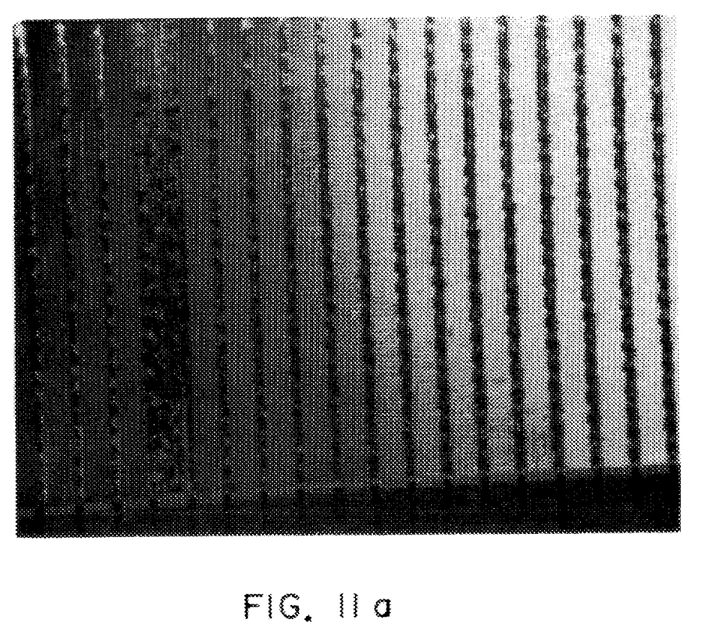
Figure 11B:
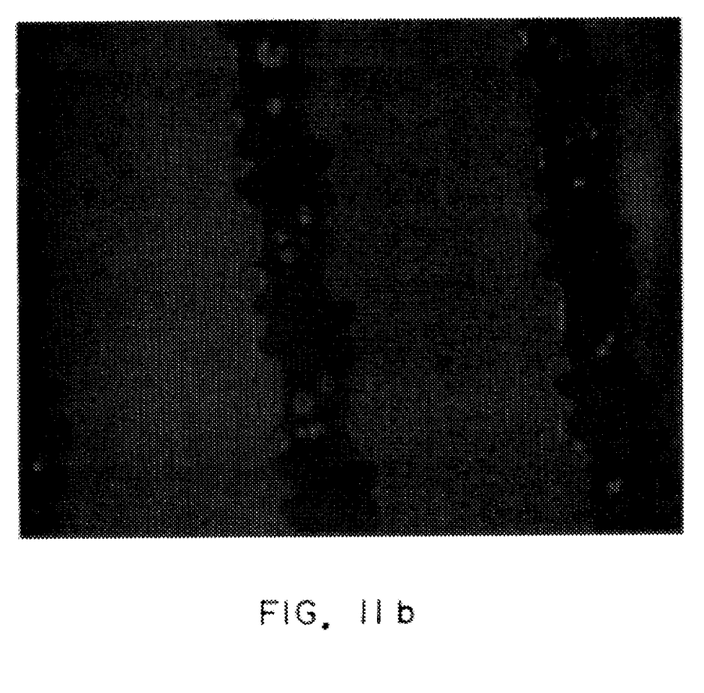

With an anti-foam agent, the mask was 0.0006 inches thick. Upon plating, the product produced traces which were 0.0013 inch thick. FIG. 11a shows the photomicrograph at 6X of the product traces with nominal 0.030 inch wide lines. FIG. 11b shows the same product traces at 50X. The plated material was covered with a fine dust of copper particles as it exited the plating bath. These fine particles were easily brushed off the surface and are the result of microcracks in the mask.

Figure 12:
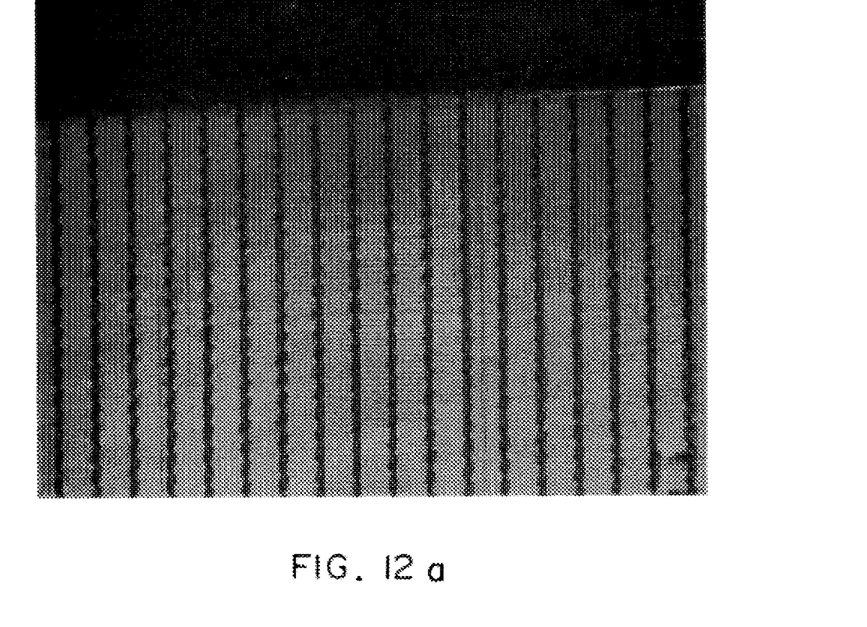

The experiment was repeated without an anti-foam and the mask was 0.0015 inch thick. Upon plating, the product traces were 0.001 inch thick. FIG. 12a and 12b correspond to the same enlargement as FIG. 11a and 11b, and as illustrated by FIG. 12a and b the sharpness of definition of the traces is quite apparent. Additionally, the fine copper dust was essentially absent showing the great reduction in microcracks.

Many changes, modifications, variations, and other uses and applications of the subject invention will, however, become apparent to those skilled in the art after considering the specification and the accompanying drawings which disclose preferred embodiments thereof. All such changes, modifications, variations and other uses which do not depart from the spirit of the invention are deemed to be covered by the invention which is limited only by the claims that follow.

We claim:

1. A method of making flexible flat cable, comprising the steps of:
   depositing conductive metal in the range of 1000 to 2500 Angstroms thick onto a flexible film having a thickness in the range of 0.1 to 10 mils.,
   covering first portions of the metal with a resist material arranged in a pattern,
   depositing metal circuit material onto second portions of the metal, and
   removing the resist material and the first portions of the metal,
   wherein the resist material pattern has at least two depths, at the edges of the second portions of the metal the resist material is equal or greater than the desired depth of the metal circuit material and the remaining first portions of the metal is coated sufficiently with the resist material to prevent electrochemical growth of the metal circuit material.

2. A method as recited in claim 1, and further comprising: removing the resist material with a solvent.

3. A method as recited in claim 1, and further comprising: removing the first portions of the metal with a metal etchant.

4. A method as recited in claim 1, wherein the resist material is a foamed material.

5. A method as recited in claim 1, wherein the first few 100 Å of conductive metal is sputtered and the remaining conductive metal is evaporated onto the flexible film.

6. In a method of ink jet printing, wherein a pattern of ink is applied by an ink jet, the improvement comprising:
   applying a pattern of an ink resistant to acidic chemical baths by ink jet onto a composite sheet constructed of a first metal covering a flexible film,
   depositing metal circuit material onto the metal without depositing the metal onto the ink, and
   removing the ink and the first metal,
   wherein the ink resistant has at least two depths, at the edges of the pattern the ink resistant is equal or greater than the desired depth of the metal circuit material and the remaining pattern is coated sufficiently with ink resistant to prevent electrochemical growth of the metal circuit material.

7. A method as recited in claim 6, wherein the resist material is a foamed material.

8. In a method of ink jet printing, wherein a pattern of ink is applied by an ink jet, the improvement comprising:
   applying a pattern of an ink resistant to basic chemical baths by ink jet onto a composite sheet constructed of a first metal covering a polyester,
   depositing metal circuit material onto the metal without depositing the metal onto the ink, and
   removing the ink and the first metal to provide a circuit on the sheet,
   wherein the ink resistant has at least two depths, at the edges of the pattern the ink resistant is equal or greater than the desired depth of the metal circuit material and the remaining pattern is coated sufficiently with ink resistant to prevent electrochemical growth of the metal circuit material.

9. In a method as recited in claim 8, the improvement comprising the step of: laminating a second layer of polyester to protect the circuit.

10. In a method as recited in claim 8, the improvement comprising the step of: laminating a second layer of polyester to protect the circuit, and providing holes in the second film to permit access to the circuit.

11. A method as recited in claim 8, wherein the resist material is a foamed material.

12. A method of making an electrical circuit comprising the steps of:
   Sputtering 100 to 300 Angstroms and evaporating 2700 Angstroms thick Copper film onto polyester film having a range of thickness from 0.001 inch (0.0025 cm.) to 0.10 inch.;
   Applying circuit masks by ink jet printer,
   Plating a first metal onto circuit patterns circumscribed by the masks to produce a circuit having a desired thickness;
   Plating Tin to the desired thickness onto the first metal;
   Removing the masks to expose the Copper film; and
   Removing the Copper film exposed by removal of the masks with the circuit being protected by the Tin;
   Cleaning and drying the circuit and the polyester film, and laminating a second layer of polyester on the circuit to protect the circuit.

13. A method as recited in claim 12, wherein the circuit mask has at least two depths, at the edges of the circuit pattern the mask is equal or greater than the desired depth of the metal circuit material and the remaining masked area is coated sufficiently to prevent electrochemical growth of the metal circuit material.

14. A method as recited in claim 12, further comprising the steps of: providing holes in the second film to permit access to the circuit.

15. A method as recited in claim 12, wherein the circuit masks is a foamed material.

16. A method of making flexible flat cable, comprising the steps of:
   depositing conductive metal in the range of 1000 to 2500 Angstroms thick onto a flexible film having a thickness in the range of 0.1 to 10 mils.,
   covering first portions of the metal with a resist material arranged in a pattern,
   depositing metal circuit material onto second portions of the metal, and
   removing the resist material and the first portions of the metal, wherein
   the resist material pattern has at least two depths, at the edges of the second portions of the metal the resist material is equal or greater than the desired depth of the metal circuit material and the remaining first portions of the metal is coated sufficiently with the resist material to prevent electrochemical growth of the metal circuit material.

17. A method as recited in claim 16, and further comprising: removing the resist material with a solvent.

18. A method as recited in claim 16, and further comprising: removing the first portions of the metal with a metal etchant.

19. A method of making flexible flat cable harness, comprising the steps of:

depositing conductive metal in the range of 1000 to 2500 Angstroms thick onto a flexible film having a thickness in the range of 0.1 to 10 mils., covering first portions of the metal with a resist material arranged in a pattern, depositing metal circuit material onto second portions of the metal, and removing the resist material and the first portions of the metal.

20. A method as recited in claim 19, wherein the resist material pattern has at least two depths, at the edges of the second portions of the metal the resist material is equal or greater than the desired depth of the metal circuit material and the remaining first portions of the metal is coated sufficiently with the resist material to prevent electrochemical growth of the metal circuit material.

21. A method as recited in claim 19, and further comprising: removing the resist material with a solvent.

22. A method as recited in claim 19, wherein the resist material is a foamed material.

23. In a method of printing flat, flexible electrical circuits, wherein a pattern of ink is applied by a seamless rotary screen, the improvement comprising:

pre-conditioning the polyester by exposing it to a temperature that is equal to or greater the maximum temperature the film or circuit will experience in later processing or in final service life;

applying a pattern of an ink resistant to basic chemical baths by a seamless rotary screen onto a composite sheet constructed of a first metal covering a flexible film, depositing metal circuit material onto the metal without depositing the metal onto the ink, and removing the ink and the first metal to provide a circuit on the sheet.

24. In a method as recited in claim 23, wherein the ink resistant has at least two depths, at the edges of the pattern the ink resistant is equal or greater than the desired depth of the metal circuit material and the remaining pattern is coated sufficiently with ink resistant to prevent electrochemical growth of the metal circuit material.

25. In a method as recited in claim 23, the improvement comprising the step of: laminating a second layer of polyester to protect the circuit.

26. In a method as recited in claim 23, the improvement comprising the step of: laminating a second layer of polyester to protect the circuit, and providing holes in the second film to permit access to the circuit.

27. A method as recited in claim 23, wherein the resist material is a foamed material.

28. A method of making an electrical circuit comprising the steps of:

Sputtering 2500 Angstroms thick Copper film onto polyester film having a range of thickness from 0.001 inch (0.0025 cm.) to 0.10 inch;

Applying circuit masks by ink jet printer,

Plating a first metal onto circuit patterns circumscribed by the masks to produce a circuit having a desired thickness;

Plating Tin to the desired thickness onto the first metal;

Removing the masks to expose the Copper film; and

Removing the Copper film exposed by removal of the masks with the circuit being protected by the Tin;

Cleaning and drying the circuit and the polyester film, and laminating a second layer of polyester on the circuit to protect the circuit.

29. A method as recited in claim 28, further comprising the steps of: providing holes in the second film to permit access to the circuit.

30. A method of making an electrical circuit comprising the steps of:

depositing conductive metal in the range of 1000 to 3000 Angstroms thick onto a flexible film having a thickness in the range of 0.1 to 10 mils, covering first portions of the metal with a resist material arranged in a pattern, depositing metal circuit material onto second portions of the metal, removing the resist material and the first portions of the metal, wherein the resist material is foamed material.

* * * * *